(12) United States Patent
Martins et al.

(10) Patent No.: US 11,232,976 B2
(45) Date of Patent: Jan. 25, 2022

(54) TREATING A SILICON ON INSULATOR WAFER IN PREPARATION FOR MANUFACTURING AN ATOMISTIC ELECTRONIC DEVICE INTERFACED WITH A CMOS ELECTRONIC DEVICE

(71) Applicants: Quantum Silicon Inc., Edmonton (CA); The Governors of the University of Alberta, Edmonton (CA); National Research Council of Canada, Ottawa (CA)

(72) Inventors: Bruno Vieira Da Cunha Martins, Edmonton (CA); Robert A. Wolkow, Edmonton (CA); Marco Taucer, Ottawa (CA); Jason Pitters, Sherwood Park (CA)

(73) Assignees: National Research Council of Canada, Ottawa (CA); The Governors of the University of Alberta, Edmonton (CA); Quantum Silicon Inc., Edmonton ( * ) Notice: Subject to any disclaimer, the term of this patent is extended or adjusted under 35 U.S.C. 154(b) by 30 days.

(21) Appl. No.: 16/632,460

(22) PCT Filed: Jun. 29, 2018

(86) PCT No.: PCT/CA2018/050807
§ 371 (c)(1),
(2) Date: Jan. 20, 2020

(87) PCT Pub. No.: WO2019/014753
PCT Pub. Date: Jan. 24, 2019

(65) Prior Publication Data
US 2021/0159116 A1 May 27, 2021

Related U.S. Application Data

(60) Provisional application No. 62/534,981, filed on Jul. 20, 2017.

(51) Int. Cl.
*H01L 21/00* (2006.01)
*H01L 21/762* (2006.01)
(Continued)

(52) U.S. Cl.
CPC .. *H01L 21/76264* (2013.01); *H01L 21/02096* (2013.01); *H01L 21/28518* (2013.01); *H01L 21/3212* (2013.01); *H01L 27/1207* (2013.01)

(58) Field of Classification Search
None
See application file for complete search history.

(56) References Cited

U.S. PATENT DOCUMENTS 5,202,277 A * 4/1993 Kameyama ....... H01L 21/28114
257/327
7,678,668 B2 3/2010 Shimomura et al.
(Continued)

OTHER PUBLICATIONS

Int'l. Search Report for PCT/CA2018/050807, dated Sep. 28, 2018.
(Continued)

*Primary Examiner* — Reema Patel
(74) *Attorney, Agent, or Firm* — Blue Filament Law PLLC (57) ABSTRACT

A method for treating a wafer is provided with a portion of a semiconductor layer is selectively removed from the wafer so as to create an inactive region of the wafer surrounding a first active region of the wafer. The inactive region of the wafer has an exposed portion of an insulator layer, but none of the semiconductor layer. The first active region of the wafer includes a first portion of the semiconductor layer and a first portion of the insulator layer. At least one conductor is formed in contact with the first portion of the semiconductor layer, such that the conductor and the first portion of the semiconductor layer form a portion of an electrical circuit. The first active region of the wafer is selectively
(Continued)

treated to remove a native oxide layer from the first portion of the semiconductor layer. A resulting wafer is also disclosed.

16 Claims, 4 Drawing Sheets

(51) Int. Cl.
    *H01L 21/02* (2006.01)
    *H01L 21/285* (2006.01)
    *H01L 21/321* (2006.01)
    *H01L 27/12* (2006.01)

(56) References Cited

U.S. PATENT DOCUMENTS

| | | |
|---|---|---|
| 9,202,572 B2 | 12/2015 | Bronner et al. |
| 2008/0153183 A1* | 6/2008 | Mathews .......... H01L 21/31111 438/14 |
| 2009/0246936 A1 | 10/2009 | Yamazaki et al. |
| 2013/0001691 A1* | 1/2013 | Yin ....................... H01L 29/458 257/347 |

OTHER PUBLICATIONS

Joachim, Nanopackaging Requests for Atomic Scale Circuits and Molecule-Machines, Nanopackaging: From Nanomaterials to the Atomic Scale, Advances in Atom and Single Molecule Machines, DOI 10.1007/978-3-319-21194-7_5.

Skeren, et al., "CMOS platform for atomic-scale device fabrication," Manuscript, Aug. 24, 2018 IOP Science, Nanotechnology, vol. 29, No. 43.

\* cited by examiner

FIG. 7

TREATING A SILICON ON INSULATOR WAFER IN PREPARATION FOR MANUFACTURING AN ATOMISTIC ELECTRONIC DEVICE INTERFACED WITH A CMOS ELECTRONIC DEVICE

FIELD OF THE INVENTION

The present invention relates generally to integrated circuit electronics, particularly to methods for integrating CMOS electronics and atomistic electronics.

BACKGROUND OF THE INVENTION

Complementary metal-oxide-semiconductor (CMOS) is a method of manufacturing integrated circuit (IC) electronics. The fundamentals of CMOS technology may be traced at least to U.S. Pat. No. 33,568,858 to Wanlass. IC electronics manufactured using CMOS have since become prevalent in virtually all kinds of modern computing devices. CMOS processes are well understood. In general, CMOS involves subjecting a silicon-based semiconductor wafer (e.g., silicon doped with p-type impurities) to sequential steps of oxidation, photolithography, etching, cleaning, diffusion or ion implantation, and metallic deposition. For example, oxidation involves heating the semiconductor wafer at high temperatures (e.g., 400 degrees Celsius) to establish a submicron thick layer of silicon oxide on the wafer. Photolithography involves selectively applying a photoresist material that is chemically resistant to an etchant to the silicon oxide layer so as to define a mask pattern on the silicon oxide layer. Etching involves exposing the areas of the silicon oxide layer that are exposed by the photoresist material to an etchant comprising acid so as to selectively remove such areas of the silicon oxide layer and thereby define n-wells in the silicon oxide layer. Cleaning involves exposing the photoresist on the silicon oxide layer to various reagents to remove the photoresist from the silicon oxide layer. These steps result in selectively positioned regions and layers of p-type and n-type doped semiconductor source and drain regions, and conductive metallic interconnects and vias, to collectively define circuit components such as transistors.

Atomistic electronics refers to electronic devices having components at the atomic scale. Examples of atomistic electronic devices are disclosed in U.S. Pat. Nos. 8,076,668 and 8,278,654 to Wolkow et al. and U.S. Pat. Nos. 8,816,479 and 9,213,945 to Diablio et al. These patents teach that atomistic electronic devices having dangling bonds can be created by controlled removal of single hydrogen atoms from a hydrogen passivated silicon surface.

Atomistic electronics is a relatively new technology compared with CMOS. While atomistic electronics holds promise for quantum computing, this has not yet been realized at an industrial scale. A first step towards this direction would be to integrate atomistic electronics with existing CMOS electronics, since both can be based on silicon substrates. A practical obstacle to doing so is that preparatory steps for making the atomistic electronics would damage CMOS electronics. Manufacturing atomistic electronics as described in the above patents requires a pristine silicon surface—i.e., substantially free of contaminants and defects. This may be achieved in part by exposing the silicon surface to high temperatures (e.g., 1100 degrees Celsius) or treating them with acidic materials. However, such treatments may damage metallic interconnects in CMOS (e.g. if heating is near or above the melting point of metals typically used for interconnects such as copper, aluminum, silver, gold), deplete dopants from the silicon substrate, or counterproductively, cause surface irregularities on the silicon surface.

Thus, there remains a need in the art for a method to prepare a pristine silicon surface on a silicon-based substrate on which CMOS electronics already exist or are to be manufactured. Preferably, such a method utilizes processes that are conventional in CMOS manufacturing.

SUMMARY OF THE INVENTION

The present invention relates generally to integrated circuit electronics, particularly to methods for integrating CMOS electronics and atomistic electronics.

In one aspect, the invention comprises a method for treating a wafer comprising a semiconductor layer overlying an insulator layer, the method comprising the steps of:
  (a) selectively removing a portion of the semiconductor layer from the wafer so as to create an inactive region of the wafer surrounding a first active region of the wafer, wherein:
    (i) the inactive region of the wafer comprises an exposed portion of the insulator layer, but none of the semiconductor layer; and
    (ii) the first active region of the wafer comprises a first portion of the semiconductor layer and a first portion of the insulator layer;
  (b) forming at least one conductor in contact with the first portion of the semiconductor layer, such that the conductor and the first portion of the semiconductor layer form a portion of an electrical circuit; and
  (c) selectively treating the first active region of the wafer to remove a native oxide layer from the first portion of the semiconductor layer, wherein the treating comprises energizing the electrical circuit with an external power source to induce resistive heating of the first portion of the semiconductor layer.

In another aspect, the invention comprises a wafer for manufacturing of an atomistic electronic device, the wafer comprising a semiconductor layer overlying an insulator layer, the wafer characterized by:
  (a) an inactive region of the wafer surrounding a first active region of the wafer, wherein the inactive region of the wafer comprises an exposed portion of the insulator layer, but none of the semiconductor layer, and the first active region of the wafer comprises a first portion of the semiconductor layer and a first portion of the insulator layer;
  (b) at least one conductor in contact with the first portion of the semiconductor layer.

Additional aspects and advantages of the present invention will be apparent in view of the description, which follows. It should be understood, however, that the detailed description and the specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will now be described by way of an exemplary embodiment with reference to the accompanying simplified, diagrammatic, not-to-scale drawings. In the drawings.

DETAILED DESCRIPTION OF PREFERRED EMBODIMENTS

Before the present invention is described in further detail, it is to be understood that the invention is not limited to the particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein.

It must be noted that as used herein and in the appended claims, the singular forms "a," "an," and "the" include plural referents unless the context clearly dictates otherwise.

The present invention relates generally to integrated circuit electronics, and more particularly to methods for integrating CMOS electronics and atomistic electronics.

In one aspect, the invention comprises a method for treating a wafer comprising a semiconductor layer overlying an insulator layer, the method comprising the steps of:
  (a) selectively removing a portion of the semiconductor layer from the wafer so as to create an inactive region of the wafer surrounding a first active region of the wafer, wherein:
    (i) the inactive region of the wafer comprises an exposed portion of the insulator layer, but none of the semiconductor layer; and
    (ii) the first active region of the wafer comprises a first portion of the semiconductor layer and a first portion of the insulator layer;
  (b) forming at least one conductor in contact with the first portion of the semiconductor layer, such that the conductor and the first portion of the semiconductor layer form a portion of an electrical circuit; and
  (c) selectively treating the first active region of the wafer to remove a native oxide layer from the first portion of the semiconductor layer, wherein the treating comprises energizing the electrical circuit with an external power source to induce resistive heating of the first portion of the semiconductor layer.

In another aspect, the invention comprises a wafer for manufacturing of an atomistic electronic device, the wafer comprising a semiconductor layer overlying an insulator layer, the wafer characterized by:
  (a) an inactive region of the wafer surrounding a first active region of the wafer, wherein the inactive region of the wafer comprises an exposed portion of the insulator layer, but none of the semiconductor layer, and the first active region of the wafer comprises a first portion of the semiconductor layer and a first portion of the insulator layer;
  (b) at least one conductor in contact with the first portion of the semiconductor layer.

As used herein, the term "nanoscale" in describing the dimensions of a component refers to the component having dimensions in the range of about 1 nm to about 1000 nm.

Step 1: Provide SOI Wafer

Figure 1:
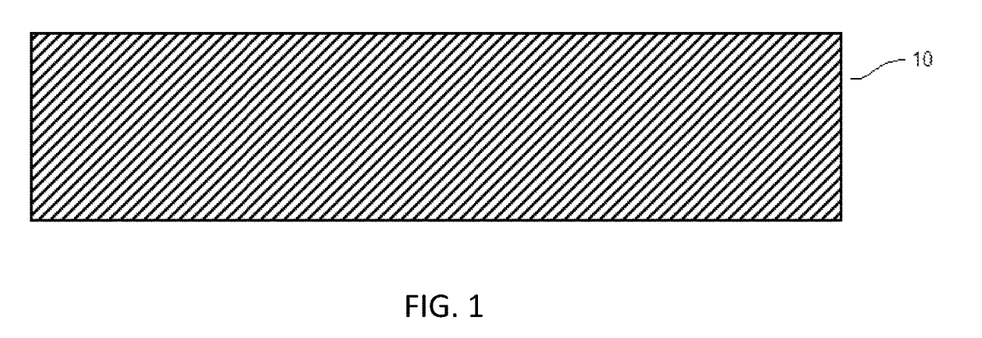
FIG. 1 shows a top view of a silicon on insulator wafer.
Figure 2:
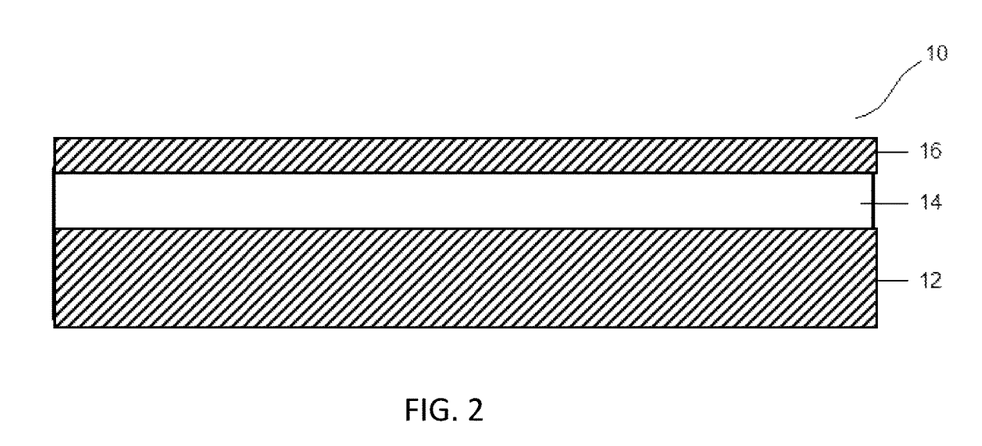
FIG. 2 shows a cross-sectional view of the silicon on insulator wafer of FIG. 1.

The invention makes use of a "silicon on insulator" (SOI) wafer 10 (FIG. 1). SOI wafers and manufacturing thereof are known in the art. As shown in FIG. 2, an SOI wafer 10 consists of three layers: a bottommost "bulk" layer 12 (also known as a "handle layer") of silicon, an intermediate "buried" layer 14 (also known as a "BOX layer", or "insulator layer") of silicon dioxide insulator, and a topmost "active" layer 16 (also known as a "semiconductor layer" or "device layer") of silicon, which is typically doped. Both the bulk layer 12 and the active layer 16 may be doped. The bulk layer 12 is typically relatively thick compared with the buried layer 14 and active layer 16, but the invention is not limited by any particular thicknesses of the layers 12, 14, 16. In one embodiment, the active layer 16 has a thickness ranging from about 100 nm to about 100 microns. In one embodiment, the active layer 16 has a thickness ranging from about 100 nm to about 400 nm. If the active layer 16 of the SOI wafer 10 is thicker than this range, it may be reduced if desired by wet silicon etching processes, which is known to persons skilled in the art.

Figure 3:
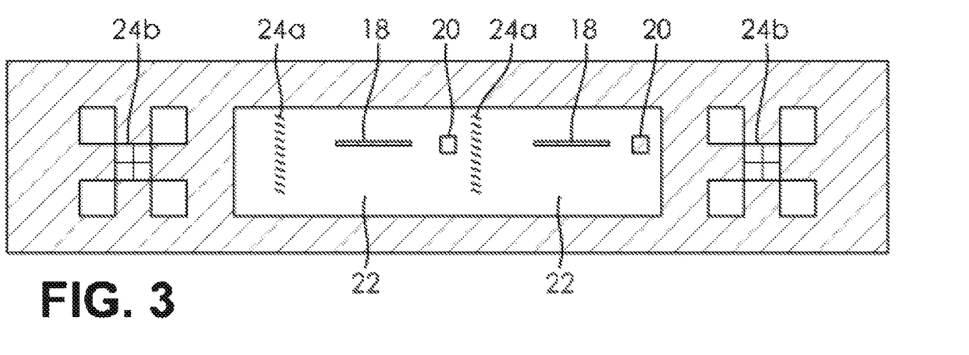
FIG. 3 shows a top view of the silicon on insulator wafer of FIG. 2, with a portion of the active layer removed to define an active region surrounded by an inactive region of the wafer.

Step 2: Remove a Portion of the Active Layer to Define an Active Region Surrounded by Inactive Region of the Wafer As shown in FIG. 3, a portion of the active layer 16 is selectively removed from the SOI wafer 10 so that the wafer 10 has "active regions" 18, 20 where the wafer 10 consists of the base 12, buried 14 and active 16 layers that are surrounded by an "inactive regions" 22 where the wafer 10 consists only of the base layer 12 and the exposed buried layer 14. One or more alignment marks 24a, 24b of various configurations known to persons skilled in the art may be formed to facilitate positioning of desired features on the wafer 10.

The selective removal of the active layer 16 may be performed by techniques known to persons skilled in the art of CMOS including, but not limited to, photolithographic masking and etching (e.g., "dry" reactive-ion etching (RIE)

using plasma etchants). When viewed in cross-section, the active layers 16 of the active regions 18, 20 form mesas relative to the exposed buried layer 14. As used herein, the term "mesa" refers to a raised area which is flat. Such an area serves, for instance, to isolate regions of the wafer 10, and may be produced by removing areas surrounding the zone where the mesa is desired. Since the exposed buried layer 14 is an insulator and the active layers 16 of the mesas are not in contact with each other, the active layers 16 of the active regions 18, 20 of the SOI wafer 10 are electrically insulated from each other.

The first active region 18 provides a site for the manufacturing of an atomistic electronic device, and is therefore referred to as the "atomistic active region." In one embodiment, the atomistic active region 18 has an elongate aspect ratio with dimensions of 1 mm×50 µm so that the cross-sectional area of the active layer 16 in the atomistic active region 18 in the direction transverse to the elongate region is relatively small, while the distance between the ends of the active layer 16 in the atomistic active region 18 is relatively long. These proportions are selected so that the active layer 16 of the atomistic active region 18 effectively forms a two-terminal resistor between its ends in the elongate direction.

The second active region 20 provides a site on which a CMOS device already exists, or is to be manufactured, and is therefore referred to as the "CMOS active region." In one embodiment, the CMOS active region 20 has a relatively equal aspect ratio, but can be varied to suit a particular CMOS layout.

Figure 4:
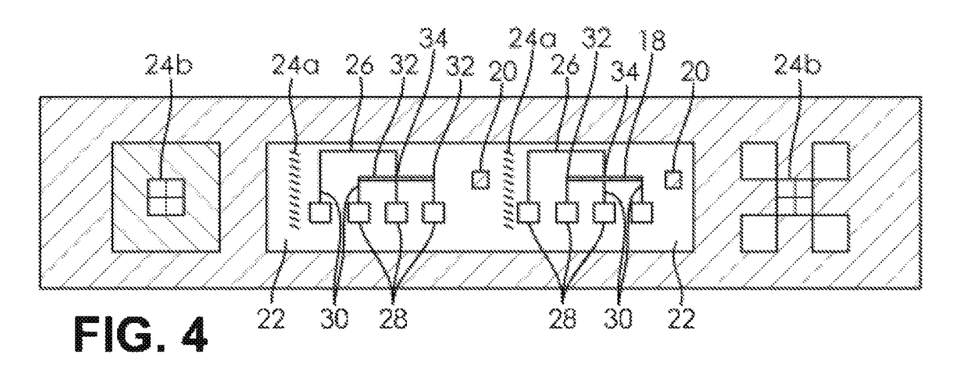
FIG. 4 shows a top view of the silicon on insulator wafer of FIG. 3, with conductors for connecting the atomistic active region to an electrical circuit.

Step 3: Form Conductors for Connecting the Atomistic Active Region to an Electrical Circuit Conductors 26 are formed that are connected to the active layer 16 of the atomistic active region 18. A purpose of forming the conductors 26 is to form an electrical circuit including the active layer 16 of the atomistic active region 18 through which an electrical current can be applied, without applying electrical energy to the CMOS active region 20.

The formation of the terminals and conductors 26 can be performed by techniques known to persons skilled in the art of CMOS including, but not limited to, photolithographic masking, metallization (e.g. sputtering deposition, or thermal evaporation deposition), and annealing (e.g., rapid thermal annealing (RTA)).

In one embodiment, as shown in FIG. 4, the conductors 26 are formed on the inactive regions 22, on top of the exposed buried layer 14. In one embodiment, the conductors 26 may be formed directly on top of the active layer 16 of the atomistic active region 18, with it being understood that the atomistic active region 18 may be shaped to support the conductors 26 as shown in FIG. 4. This avoids the need for the conductor 26 to overcome the physical upward step from the exposed buried oxide layer 14 to the active layer 16 of the atomistic active region 18 (i.e., to climb the "mesa"), which can cause electrical instability.

In one embodiment, the conductors 26 are formed by co-sputtering and RTA of silicide. In one embodiment, the silicide comprises titanium silicide ($TiSi_2$). In one embodiment, silicide can be annealed by RTA at a temperature ranging from about 700 degrees Celsius to about 800 degrees Celsius. In one embodiment, the conductors 26 can be formed by thermal evaporative deposition of the conductor material. As known to persons skilled in the art, thermal evaporative deposition involves heating the conductive material to vaporize the conductive material and allowing the vapor to travel in vacuum, on to the SOI wafer 10.

In one embodiment, as shown in FIG. 4, the conductors 26 are in the form of four terminals in the shape of rectangular "pads" 28, each having an elongate "finger" 30 extending therefrom to the atomistic active region 18. The pads 28 provide two pairs of sources and drains for an external power source. A first pair of the pads 28 is connected by the fingers 30 to the terminal ends 32 of the atomistic active region 18. A second pair of the pads 28 is connected by the fingers 30 to an intermediate portion 34 of the atomistic active region 18 at a location proximal to where the atomistic electronic device is to be manufactured.

Figure 5:
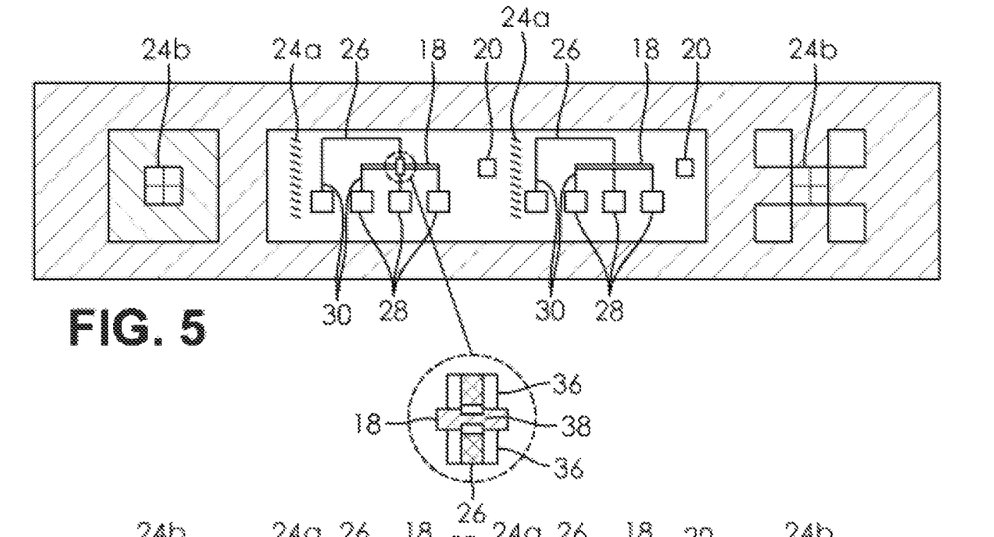
FIG. 5 shows a top view of the silicon on insulator wafer of FIG. 4, with nanoscale contacts overlapping the conductors and the atomistic active region.

Step 4: Form Nanoscale Contacts Overlapping Conductors and Atomistic Active Region In one embodiment, as shown in FIG. 5, nanoscale contacts 36 are formed in a separation gap 38 between the second pair of conductors 26, so as to partially overlap the conductors 26 and the atomistic active region 18, with a separation gap 38 between the nanoscale contacts 36. A purpose of the nanoscale contacts 36 is to provide an interface for an atomistic electronic device with the CMOS active region 20. After an atomistic electronic device has been manufactured on the atomistic active region 18 between the nanoscale contacts 36, the nanoscale contacts 36 can be used to electrically connect the manufactured atomistic electronic device with the CMOS active region 20.

In one embodiment, the nanoscale contacts 36 have a separation gap 38 of about 50 nm to about 100 nm. The nanoscale contacts 36 may be produced by techniques known to persons skilled in the art including, but not limited to, electron beam lithography (EBL) patterning, and co-sputtering of silicide. In one embodiment, the silicide comprises titanium silicide.

Step 5: Form Metallic Contacts for Conductors

Figure 6:
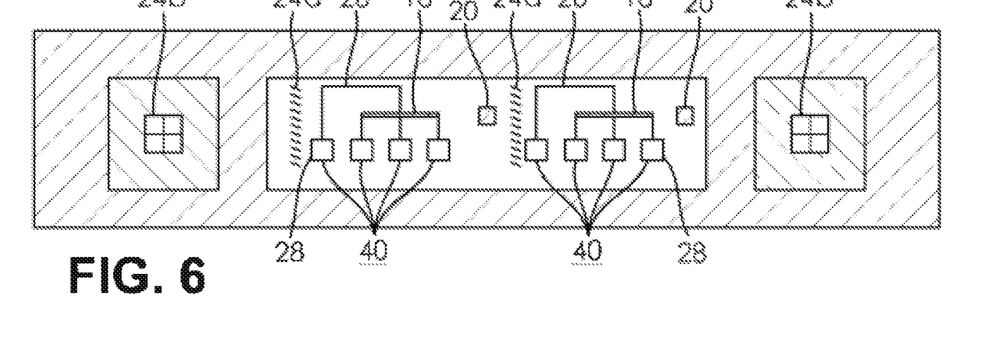
FIG. 6 shows a top view of the silicon on insulator wafer of FIG. 5, with metallic contacts for the conductors.

In one embodiment, as shown in FIG. 6, metallic contacts 40 are formed on the conductors 26 to allow for wire bonding of the conductors 26 to an external energy power source. The formation of the metallic contacts 40 can be performed by techniques known to persons skilled in the art including, but not limited to, electron beam lithographic patterning, photolithographic lift-off masking, and metallization techniques (e.g., sputtering deposition, or thermal evaporation deposition). In one embodiment, the metallic contacts 40 are formed by sputtering gold (Au) onto the pads 28 of the conductors 26.

Step 6: Wire Bonding to Contacts for Conductors

Figure 7:
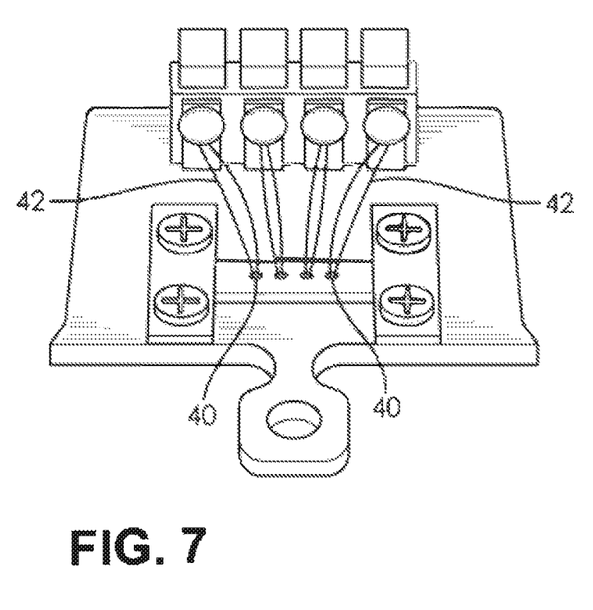
FIG. 7 shows a perspective view of the silicon on insulator wafer of FIG. 6, with wires bonded to each of the metallic contacts to connect the conductors to an external power source.

In one embodiment, as shown in FIG. 7, wires 42 are bonded to each of the metallic contacts 40 to connect the conductors 26 to an external power source. The wires 42 may be bonded to the metallic contacts 40 using techniques known to persons skilled in the art including, but not limited to, thermosonic, ultrasonic and thermo-compression bonding mechanisms to produce ball bonds or wedge bonds.

Step 7: Energize Active Layer of Atomistic Active Region to Remove Native Oxide

As known to persons skilled in the art, the active layer 16 of the SOI wafer 10 forms a "native" oxide layer when exposed to air. To remove the native oxide layer, the active layer 16 of the atomistic active region 18 is energized by applying electrical energy from an external energy source to the conductors 26 (pads 28 and fingers 30) via the metallic contacts 40. The amount of energy should be sufficient to create localized resistive heating of the active layer 16 in the atomistic active region 18 to a temperature that is sufficient to remove the native oxide layer, having regard to the pressure of the environment. Once the native oxide layer has been removed, the atomistic electronic device may be manufactured on the surface of the cleaned active layer 16.

It will be appreciated that the aforementioned elongate aspect ratio of the atomistic active region 18 increases its effectiveness as a resistor between the first pair of fingers 30, and thus facilitates the resistive heating process when the first pair of conductors 26 is energized. Further, it will be appreciated that because the atomistic active region 18 is electrically isolated from the CMOS active region 20, the latter will not be energized, and will be unaffected by the ambient heating effect of the atomistic active region 18 if positioned at a sufficient distance from the atomistic active region 18.

In order to avoid damage to the CMOS active region 20, it may be advantageous to provide means for monitoring the temperature (e.g., a nanoscale thermocouple) and means for controlling the amount of electrical energy applied to the atomistic active region 18 to avoid excessive ambient heating of the CMOS active region 20.

Oxide removal could also be performed by chemical methods and electron bombardment, as discussed below.

Step 8: Passivation of Atomistic Active Region

After removal of the native oxide from the active layer 16 of the atomistic active region 18, the active layer 16 may be passivated with hydrogen termination. This results in the active layer of the atomistic active region 18 being relatively inert, and reduces the rate of re-oxidation of the active layer 16. This allows for manufacturing of the atomistic electronic device on the active layer 16 sometime after removal of the native oxide layer.

For example, where the silicon of the active layer 16 of the atomistic active region 18 has (111)-crystal orientation, the atomistic active region 18 may be passivated by selective exposure to aqueous hydrofluoric acid (HF). This may be accomplished by using MEMS techniques to create a stencil or mask that selectively exposes the atomistic active region 18, while covering the conductors 26 (formed in Step 2), the nanoscale contacts 36 (formed in Step 4), or the metallic contacts 40 (formed in Step 5). Once the stencil is formed, the hydrofluoric acid (HF) is allowed to flow across the surface of the SOI wafer 10, through the channels defined by the mesas, and to contact the exposed atomistic active region 18. As will be appreciated by persons skilled in the art, the hydrofluoric acid will interact with the silicon of the active layer 16 such that the exposed silicon atoms are covalently bonded with hydrogen. In other embodiments, other chemicals, such as ammonium fluoride $NH_4F$, might also be used to passivate the atomistic active region 18 with hydrogen termination.

First Variation of Method

As known to persons skilled in the art, titanium silicide deposited onto silicon may react with silicon in such a manner that the silicon is locally consumed. This may result in local troughs or steps of the active layer 16 in the vicinity of the interface with the titanium silicide, which are unde-sirable because they may impair the integrity of the connection between the conductors 26 and nanoscale contacts 36 with the silicon of the atomistic active region 18.

This can be avoided by a variant of the above method in which Steps 3 and 4, and an additional step of chemical-mechanical planarization (CMP) are performed before Steps 2, 5 through 7. In order to perform Steps 3 and 4 before Step 2, it is necessary to create shallow trenches, through the active layer 16 to the level of the buried layer 14, and deposit the silicide (for example, titanium silicide) in the trenches. This can be performed using shallow trench isolation (STI) techniques known to persons skilled in the art. For the pads 28 and fingers 30 of Step 3, this can be performed by photolithographic lift-off masking, and co-sputtering of silicide. For the nanoscale contacts 36 of Step 4, this can be performed by electron beam lithographic lift-off masking, co-sputtering of silicide, and RTA which are techniques known in the art. Once the pads 28, fingers 30, and nanoscale contacts 36 have been created, chemical-mechanical planarization (which is known to person skilled in the art of CMOS) can be used to remove excess silicide above the active layer 16, so that the top surface of the silicide is level and flush with the active layer 16. When performing Step 2, it will be appreciated that the etchant selected to remove the active layer 16 should preferentially remove the active layer 16 over the already deposited silicide.

Second Variation of Method

In the above embodiment of the method, an electrical current is applied to the atomistic active region 18 to thermally decompose the native oxide layer on the active layer 16 of the atomistic active region 18. For example, when sufficiently heated, silicon oxide decomposes to silicon and oxygen.

In addition to heating of the native oxide layer by electrical heating alone, removal of the native oxide layer may be effected by subjecting the native oxide layer to electron bombardment, with the tip of the electron gun acting as an anode, and the bombarded surface acting as the cathode. In this context, it will be understood that "electron bombardment" involves applying an accelerating voltage between the tip of the electron gun and the wafer to attract electrons to the wafer. As compared with heating by solely by electrical resistance, the combination of heating by electrical resistance and electron bombardment may allow for removal of native oxide layer at lower temperatures—e.g. less than about 800 degrees Celsius with electron bombardment, versus at least about 800 degrees Celsius by application of electrical current. In embodiments, the surface of the native oxide layer may be warmed to between about 300 degrees Celsius to about 600 degrees Celsius by electrical heating, and then subjecting the warmed native oxide layer to electron bombardment.

Third Variation of Method

In addition or alternative to removing the native oxide layer from the atomistic active region 18 by thermal decomposition, the native oxide layer may be removed by chemical treatment.

It should be apparent, however, to those skilled in the art that many more modifications besides those already described are possible without departing from the inventive concepts herein. The inventive subject matter, therefore, is not to be restricted except in the scope of the disclosure. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

REFERENCES

All publications mentioned are incorporated herein by reference (where permitted) to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates, which may need to be independently confirmed.

Dilabio, G. A.; Wolkow, R. A.; Pitters, J. L.; Piva, P. G. Atomistic quantum dot. U.S. Pat. No. 8,816,479, issued Aug. 26, 2014.

Dilabio, G. A.; Wolkow, R. A.; Pitters, J. L.; Piva, P. G. Method for controlling quantum dot device by perturbing dangling bond electronic states. U.S. Pat. No. 9,213,945, issued Dec. 15, 2015.

Wanlass, F. M. Low stand-by power complementary field effect circuitry. U.S. Pat. No. 33,568,858, issued Dec. 5, 1967.

Wolkow, R. A.; Piva, P. G.; Pitters, J. L.; Dilabio, G. A. Electrostatically regulated atomic scale electroconductivity device. U.S. Pat. No. 8,076,668, issued Dec. 13, 2011.

Wolkow, R. A.; Piva, P. G.; Pitters, J. L.; Dilabio, G. A. Electrostatically regulated atomic scale electroconductivity device. U.S. Pat. No. 8,278,654, issued Oct. 2, 2012.

What is claimed is:

1. A method for treating a wafer comprising a semiconductor layer overlying an insulator layer:
    (a) selectively removing a portion of the semiconductor layer from the wafer so as to create an inactive region of the wafer surrounding a first active region of the wafer, wherein:
        (i) the inactive region of the wafer comprises an exposed portion of the insulator layer, but none of the semiconductor layer; and
        (ii) the first active region of the wafer comprises a first portion of the semiconductor layer and a first portion of the insulator layer;
    (b) forming at least one conductor in contact with the first portion of the semiconductor layer, such that the conductor and the first portion of the semiconductor layer form a portion of an electrical circuit; and
    (c) selectively treating the first active region of the wafer to remove a native oxide layer from the first portion of the semiconductor layer, wherein the treating comprises energizing the electrical circuit with an external power source to induce resistive heating of the first portion of the semiconductor layer.

2. The method of claim 1, wherein step (c) comprises energizing the electrical circuit to induce resistive heating of the native oxide layer to a temperature sufficient to thermally decompose the native oxide layer.

3. The method of claim 1 wherein the treating comprises:
    energizing the electrical circuit to induce resistive heating of the native oxide layer to warm the native oxide layer; and
    subjecting the warmed native oxide layer to electron bombardment.

4. The method of claim 1 wherein the conductor comprises a silicide.

5. The method of claim 1 wherein in step (b), the conductor is formed at least partially on top of the first portion of the active layer or on top of the exposed portion of the insulator layer.

6. The method of claim 1 further comprising, after step (c), passivating the first portion of the semiconductor layer with hydrogen atom termination.

7. The method of claim 1 wherein step (a) comprises electron beam lithography or photolithography to define the inactive region and the first active region.

8. The method of claim 1 wherein step (a) comprises a dry etching method to define the inactive region and the first active region.

9. The method of claim 1 wherein in step (a), selectively removing the portion of the semiconductor layer further defines a second active region of the wafer surrounded by the inactive region of the wafer, wherein the second active region of the wafer comprises a second portion of the semiconductor layer and a second portion of the insulator layer, wherein the second portion of the semiconductor layer is not in contact with the first portion of the semiconductor layer, and the conductor.

10. The method of claim 1 wherein step (b) comprises electron beam lithography or photolithography to define the conductor.

11. The method of claim 1 wherein step (b) comprises deposition of a conductive material that forms the conductors.

12. The method of claim 1 wherein step (b) is performed after step (a).

13. The method of claim 1 wherein step (b) comprises the sub-steps of:
    (i) defining a trench in the wafer by selective removal of the semiconductor layer of the wafer; and
    (ii) depositing a conductive material in the trench.

14. The method of claim 13 wherein step (b) further comprises the sub-step of:
    (iii) subjecting the wafer to chemical-mechanical planarization to level the conductive material in the trench with the semiconductor layer of the first region of the wafer.

15. The method of claim 1 wherein the first portion of the semiconductor layer between the physically separate parts has a nanoscale dimension.

16. The method of claim 1 wherein in step (b), forming the conductor comprises forming a conductive pad with a metallic surface, and bonding wires to the metallic surface for connection to the electrical power source.

* * * * *